(12) United States Patent
Sano et al.

(10) Patent No.: US 10,978,358 B2
(45) Date of Patent: Apr. 13, 2021

(54) PROCESSING SYSTEM FOR A CATALYTIC LAYER OF A NOBLE METAL FORMED ON A SURFACE OF A SUBSTRATE

(71) Applicant: KABUSHIKI KAISHA TOSHIBA, Minato-ku (JP)

(72) Inventors: Mitsuo Sano, Yokohama (JP); Keiichiro Matsuo, Yokohama (JP); Susumu Obata, Yokohama (JP); Kazuhito Higuchi, Yokohama (JP); Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/531,718

(22) Filed: Aug. 5, 2019

(65) Prior Publication Data

US 2020/0051873 A1 Feb. 13, 2020

(30) Foreign Application Priority Data

Aug. 9, 2018 (JP) .............................. JP2018-150241

(51) Int. Cl.
*H01L 21/306* (2006.01)
*H01L 21/66* (2006.01)
*G01N 23/223* (2006.01)

(52) U.S. Cl.
CPC ............ *H01L 22/12* (2013.01); *G01N 23/223* (2013.01); *H01L 21/30604* (2013.01); *G01N 2223/61* (2013.01)

(58) Field of Classification Search
CPC ............... H01L 22/12; H01L 21/30604; H01L 21/30612; G01N 23/223; G01N 2223/61;
(Continued)

(56) References Cited

U.S. PATENT DOCUMENTS

2008/0090074 A1 4/2008 Matsumura et al.
2014/0248539 A1* 9/2014 Liu ...................... H01M 4/386
429/218.1
(Continued)

FOREIGN PATENT DOCUMENTS

CN 104483337 A 4/2015
EP 2 439 766 A1 4/2012
(Continued)

OTHER PUBLICATIONS

Materials Evaluation and Engineering, Inc , (2014), The Handbook of Analytical Methods for Materials. Sep. 9, 2020. https://www.mee-inc.com/hamm/energy-dispersive-x-ray-spectroscopyeds/ (Year: 2014).*

*Primary Examiner* — Kyoung Lee
*Assistant Examiner* — Christina A Sylvia
(74) *Attorney, Agent, or Firm* — Oblon, McClelland, Maier & Neustadt, L.L.P.

(57) ABSTRACT

According to one embodiment, in a processing system and determining method, a X-ray intensity of character X-rays generated by irradiating a catalytic layer of a noble metal formed on a surface of a substrate with X-rays is detected. In the processing system and the determining method, either the detected X-ray intensity or a parameter calculated using the X-ray intensity is obtained as a determination parameter. In the processing system and the determining method, based at least on the determination parameter, whether or not the catalytic layer has been formed into a state suitable for etching the surface of the substrate is determined.

11 Claims, 5 Drawing Sheets

(58) Field of Classification Search
CPC ..... G01N 2223/076; G01N 2223/6116; G01N 2223/633
See application file for complete search history.

(56) References Cited

U.S. PATENT DOCUMENTS

2015/0185170 A1    7/2015   Adhiprakasha
2017/0062230 A1    3/2017   Matsuo et al.

FOREIGN PATENT DOCUMENTS

| | | |
|---|---|---|
| JP | 2004-285290 A | 10/2004 |
| JP | 2011-101009 A | 5/2011 |
| JP | 2012-220363 A | 11/2012 |
| TW | I618929 B | 3/2018 |

\* cited by examiner

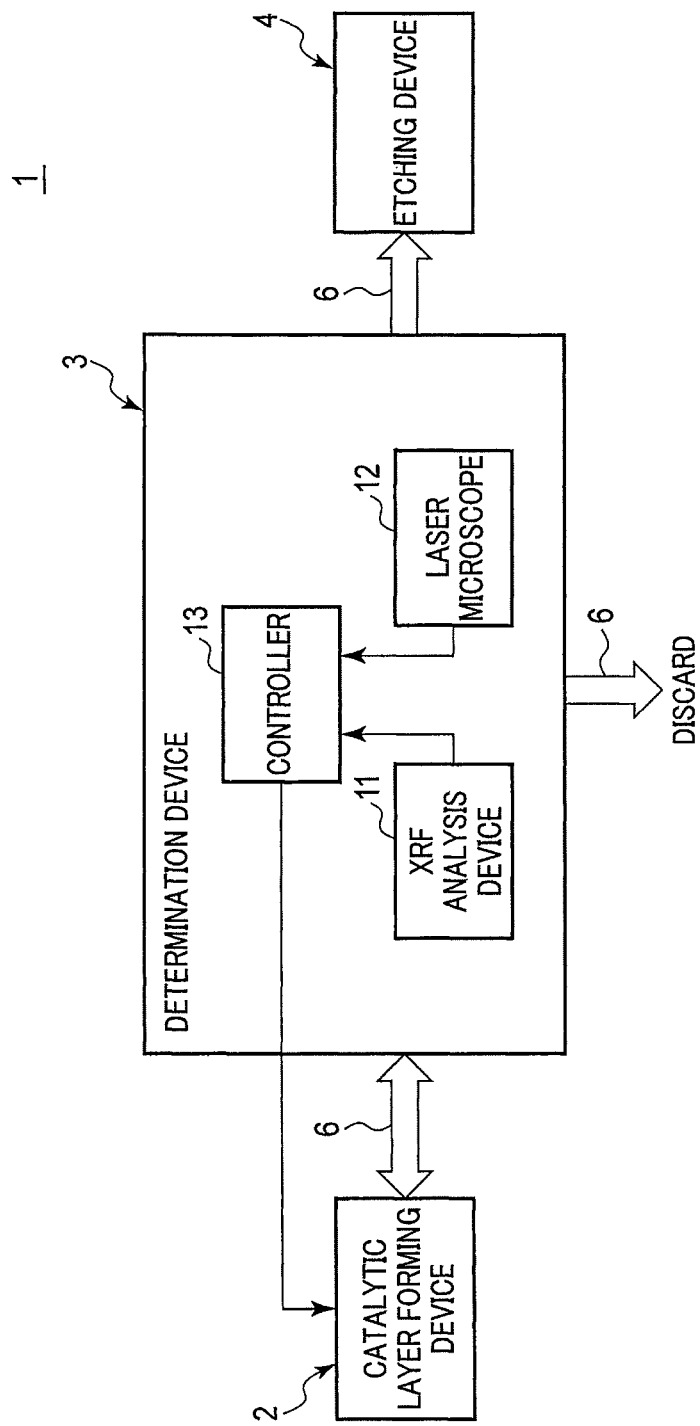
F I G. 1

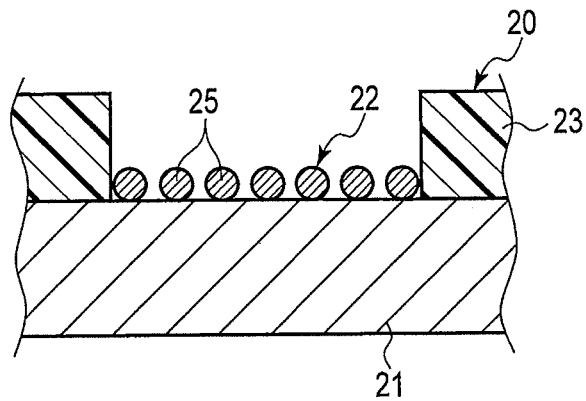
F I G. 6
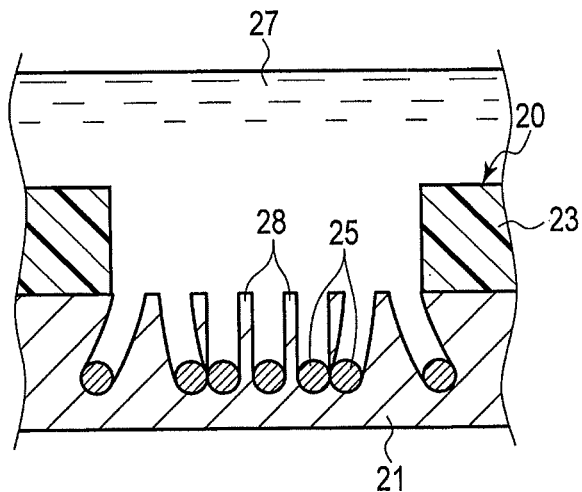
F I G. 7
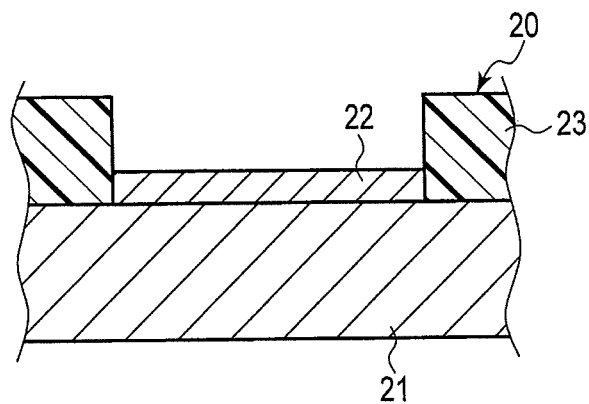
F I G. 8

PROCESSING SYSTEM FOR A CATALYTIC LAYER OF A NOBLE METAL FORMED ON A SURFACE OF A SUBSTRATE

CROSS-REFERENCE TO RELATED APPLICATIONS

This application is based on and claims the benefit of priority from Japanese Patent Application No. 2018-150241, filed Aug. 9, 2018; the entire contents of which are incorporated herein by reference.

FIELD

Embodiments described herein relate to a processing system, a determining method with regard to a catalytic layer of a noble metal, and a manufacturing method of a product.

BACKGROUND

The MacEtch (Metal-Assisted Chemical. Etching) method has been gaining attention as an etching method of the surface of substrates such as semiconductor substrates. Etching with the MacEtch method is done by, for example, forming a discontinuous catalytic layer of a noble metal onto a substrate, and then using the noble metal of the catalytic layer as a catalyst. The MacEtch method makes it possible to, for example, form deep grooves with a high aspect ratio into the substrate. When etching by the MacEtch method, it is important that the catalytic layer of the noble metal be formed properly onto the surface of the substrate.

BRIEF DESCRIPTION OF THE DRAWINGS

FIG. 1 is a block diagram schematically showing an example of a processing system according to a first embodiment, FIG. 6 is a cross-sectional view schematically showing an example of the structure when the density of the catalytic layer and the deposition amount of the noble metal in the catalytic layer are each lower than a lower limit value of a predetermined range, FIG. 7 is a schematic view showing the etching agent etching the surface of the substrate in the structure of FIG. 6 under the action of the catalyst of the catalytic layer, FIG. 8 is a cross-sectional view schematically showing an example of the structure when the density of the catalytic layer is higher than an upper limit value of the predetermined range.

DETAILED DESCRIPTION

Figure 2:
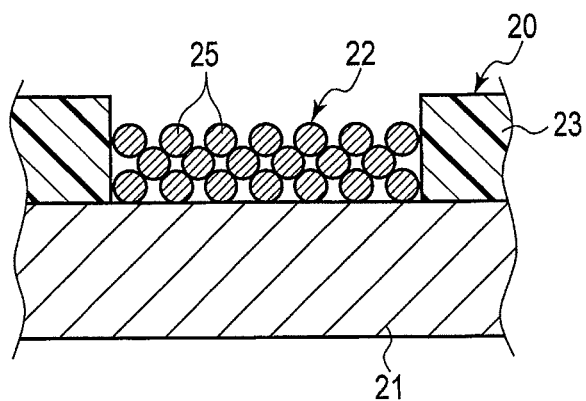
FIG. 2 is a cross-sectional view schematically showing an example of a structure having a catalytic layer formed on the surface of a substrate.

According to one embodiment, one or more processing devices of a processing system detect the X-ray intensity of character X-rays generated by irradiating the catalytic layer of a noble metal formed on the surface of a substrate with X-rays. The processing device obtains, as a determination parameter, either the detected X-ray intensity or a parameter calculated using the X-ray intensity. The processing device determines, based at least on the determination parameter, whether or not the catalytic layer has been formed into a state suitable for etching the surface of the substrate.

According to one embodiment, a determining method with regard to the catalytic layer of the noble metal formed on the surface of the substrate is provided. This determining method includes detecting the X-ray intensity of character X-rays generated by irradiating the catalytic layer with X-rays, and obtaining, as a determination parameter, the detected X-ray intensity or a parameter calculated using the X-ray intensity. The determining method further includes determining, based at least on the determination parameter, whether or not the catalytic layer has been formed into a state suitable for etching the surface of the substrate.

Further, according to one embodiment, a manufacturing method of a product is provided. This manufacturing method includes forming the catalytic layer of the noble metal on the surface of the substrate, and determining, by using the aforementioned determining method, whether or not the formed catalytic layer is in a state suitable for the etching. The manufacturing method further includes etching the surface of the substrate by causing, when it has been determined that the catalytic layer has been formed into a state suitable for the etching, the noble metal of the catalytic layer to act as a catalyst.

Hereinafter, the embodiments will be described with reference to the drawings.

First Embodiment

First, the processing system according to the first embodiment will be described. FIG. 1 is a block diagram showing an example of a processing system 1. As shown in FIG. 1, the processing system 1 includes a catalytic layer forming device 2, a determination device 3, an etching device 4, and a transporting device 6. The determination device 3 further includes an X-Ray Fluorescence (XRF) analysis device 11, a laser microscope 12, and a controller 13. In the determination device 3, one or more processing devices are configured by: the XRF analysis device 11, the laser microscope 12, and the controller 13. The controller includes a processor or an integrated circuit (control circuit) that includes: a Central Processing Unit (CPU), an Application Specific Integrated Circuit (ASIC), or a Field Programmable Gate Array (FPGA); and a storage medium such as a memory. In the determination device 3, the one or more processing devices including the controller 13 perform, by executing a program stored in the storage medium, a process explained further below.

The catalytic layer forming device 2 forms the catalytic layer of the noble metal on the surface of the substrate such as a semiconductor substrate. The structure with the catalytic layer formed on the surface of the substrate is inspected by the determination device 3. FIG. 2 shows an example of a structure 20 with a catalytic layer 22 formed on the surface of a substrate 21. In the example of FIG. 2, the substrate 21 is, for example, a semiconductor wafer, and is made of a material selected from: silicon (Si); germanium (Ge); a semiconductor made from a compound of group III elements and group V elements such as gallium arsenide (GaAs) and gallium nitride (GaN); and silicon carbide (SiC). Here, "group" refers to the "groups" of the short period periodic table. The substrate may be doped with an impurity, or a semiconductor element such as a transistor or a diode may be formed thereon. The main surface of the substrate 21 may also be parallel to any of the crystal planes of the semiconductor.

In the structure 20, a mask layer 23 is formed on the surface of the substrate 21. The mask layer 23 has an opening. The mask layer 23 covers the surface of the substrate 21 in the regions other than the opening. The regions covered by the mask layer 23 on the surface of the substrate 21 prevent the noble metal forming the catalytic layer 22 from adhering to the surface of the substrate 21. Here, the ratio (area ratio) of the area occupied by the opening of the mask layer 23 on the surface of the substrate 21 is the ratio of the opening of the mask layer 23. Examples of materials for forming the mask layer 23 are organic materials such as polyimide, fluorine resin, phenol resin, acrylic resin, and novolac resin, and inorganic materials such as silicon oxide and silicon nitride.

It is possible to form the mask layer 23 by, for example, an existing semiconductor process. The mask layer of an organic material can be formed by, for example, photolithography. The mask layer 23 of an inorganic material can be formed by, for example, forming an insulating layer by way of vapor-phase deposition, then forming a mask by way of photolithography, and then patterning the insulating layer by way of etching. The mask layer 23 of an inorganic material can be formed by oxidation or nitridation of the surface region of the substrate (semiconductor substrate) 21, then forming the mask by way of photolithography, and then patterning the insulating layer by way of etching.

The catalytic layer forming device 2 forms the catalytic layer 22 of the noble metal in the opening of the mask layer 23 on the surface of the substrate (semiconductor substrate) 21, that is, in the regions not covered by the mask layer 23. The catalytic layer 22 is, for example, a discontinuous layer, and is an aggregate of a plurality of catalyst particles 25. Each of the catalyst particles 25 is made from the noble metal. Using the catalytic layer 22 causes an oxidizing reaction in the substrate 21 in contact with the catalytic layer 22. The noble metal forming the catalytic layer 22 can be selected from, for example, gold (Au), silver (Ag), platinum (Pt), palladium (Pd), or a combination thereof. The form of the catalyst particles 25 is preferably spherical. The catalyst particles 25 may have a form other than a spherical form, for example, the form of a rod or a plate. The particle size of the catalyst particles 25 is not limited in any way, as long as the particle size is smaller than the width of the opening of the mask layer 23. For example, the particle size of the catalyst particles 25 is within a range of tens of nm to hundreds of nm, and typically within a range of 50 nm to 200 nm.

The catalytic layer 22 can be formed by, for example, way of electrolytic plating, reduction plating, or immersion plating. The catalytic layer 22 may also be formed by applying a dispersion liquid containing noble metal particles, or by way of vapor-phase deposition such as vapor deposition and sputtering. Among these methods, immersion plating can deposit a noble metal directly and uniformly on the surface of the substrate 21 at the opening of the mask layer 23. For this reason, it is particularly preferable to use immersion plating for forming the catalytic layer 22. When depositing a noble metal by immersion plating, for example, an aqueous solution of tetrachloroaurate (III) tetrahydrate or a silver nitrate solution can be used. In one example, an immersion plating solution is, for example, a compound liquid of an aqueous solution of tetrachloroaurate (III) tetrahydrate and hydrofluoric acid. Hydrofluoric acid has the function of removing the natural oxide film on the surface of the substrate 21. When the substrate 21 is immersed in the immersion plating solution, the natural oxide film on the surface of the substrate 21 is removed. A noble metal is then deposited in the region of the surface of the substrate 21 not covered by the mask layer 23, and gold is deposited in the present example. In this manner, the catalytic layer 22 is formed. The concentration of tetrachloroaurate (III) tetrahydrate in the immersion plating solution is preferably within a range of 0.0001 mol/L to 0.01 mol/L. The concentration of hydrogen fluoride in the immersion plating solution is preferably within a range of 0.1 mol/L to 6.5 mol/L.

When forming the catalytic layer 22 by way of immersion plating as described above, the state of deposition of the noble metal in the catalytic layer 22 changes according to conditions such as time of immersion in the plating solution, temperature of the plating solution, concentration of the plating solution etc. Thus, according to these conditions such as time of immersion in the plating solution, temperature of the plating solution, concentration of the plating solution etc., the deposition amount of the noble metal in the catalytic layer 22, the density of the catalytic layer 22, the thickness of the catalytic layer 22, and the coverage factor of the catalytic layer 22 change. As an example, when extending the immersion time in the plating solution, the deposition amount of noble metal increases and the catalytic layer 22 becomes thicker. When raising the temperature of the plating solution, the particle size of the catalyst particles 25 increases, and the density of the catalytic layer 22 decreases. When increasing the concentration of the plating solution, the particle size of the catalyst particles 25 increases and the density of the catalytic layer 22 decreases.

The structure 20 with the catalytic layer 22 formed on the surface of the substrate 21 is washed and dried. The structure 20 is then transported by the transporting device 6 to the determination device 3. The determination device 3 determines whether or not the catalytic layer 22 that is formed on the surface of the substrate 21 of the test subject, that is the structure 20, has been formed into a state suitable for the etching. Details on the determination by the determination device 3 are described further below. The structure 20 for which it has been determined, at the determination device 3, that the catalytic layer 22 has been formed into a state suitable for the etching is transferred by the transporting device 6 to the etching device 4. The etching device 4 then etches the transported structure 20. On the other hand, the structure 20 for which the determination device 3 has determined that the catalytic layer 22 has not been formed into a state suitable for the etching is discarded. In an example, the structure 20 for which the determination device 3 has determined that the catalytic layer 22 has not been formed into a state suitable for the etching may be returned by the transporting device 6 to the catalytic layer forming device 2 so that the catalytic layer 22 may be reformed. Here, the catalytic layer 22 may be reformed after changing the conditions such as time of immersion in the plating solution, temperature of the plating solution, concentration of the plating solution, etc.

Figure 3:
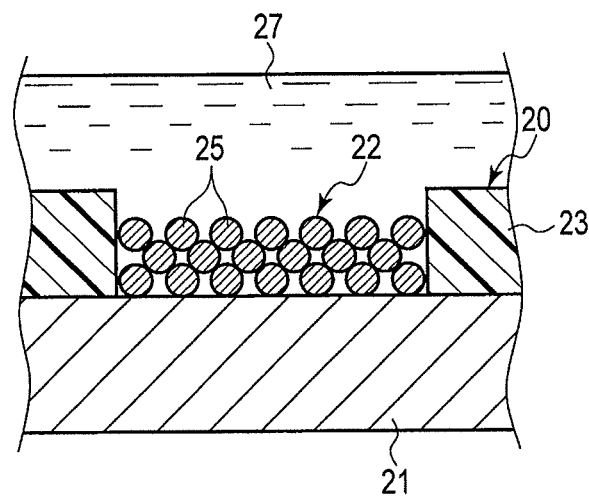
FIG. 3 is a schematic view showing the structure having the catalytic layer and a mask layer formed on the surface of the substrate just after it was immersed in an etching agent.
Figure 4:
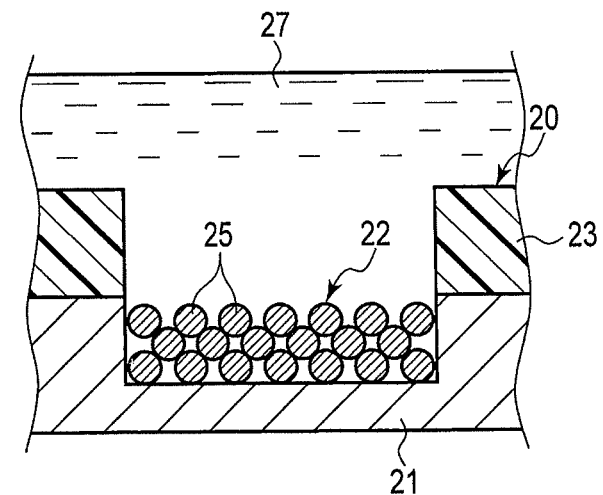
FIG. 4 is a schematic view showing the etching agent etching, from the state of FIG. 3, the surface of the substrate under the action of the catalyst of the catalytic layer.

The etching device 4 performs the etching by the MacEtch method. Here, as shown in FIG. 3, the structure 20 with the mask layer 23 and the catalytic layer 22 formed on the surface of the substrate 21 is immersed in an etching agent 27. FIG. 3 shows the structure 20 immediately after it is immersed in the etching agent 27. The etching agent 27 is an etching solution containing hydrofluoric acid and an oxidizing agent. As the etching agent 27 contacts the surface of the substrate (semiconductor substrate) 21, the oxidizing agent oxidizes the portions on the surface of the substrate 21 where the catalyst particles 25 of the catalytic layer 22 are close to the surface of the substrate 21. The hydrofluoric acid then dissolves and removes the oxidized products in the portions on the surface of the substrate 21 where the catalyst particles 25 are close to the surface of the substrate 21. In this manner, the etching agent 27 etches the surface of the substrate 21 in a direction perpendicular or substantially perpendicular to the surface of the substrate 21 in a position where the opening of the mask layer 23 is formed, as shown in FIG. 4. As the catalyst particles 25 of the noble metal of the catalytic layer 22 is caused to act as a catalyst, the surface of the substrate 21 is etched. FIG. 4 shows the etching agent 27 etching, from the state of FIG. 3, the surface of the substrate 21 under the action of the catalytic layer 22 as a catalyst.

The concentration of hydrogen fluoride in the etching agent 27 is preferably in a range of 1.0 mol/L to 20 mol/L, more preferably in a range of 5 mol/L to 10 mol/L, and even more preferably in a range of 3 mol/L to 8 mol/L. A low concentration of hydrogen fluoride makes it difficult to achieve a high etching rate. A high concentration of hydrogen fluoride may cause excessive side etching. The oxidizing agent in the etching agent 27 may be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$ and $K_2Cr_2O_7$. It should be noted that the preferable oxidizing agent is the hydrogen peroxide, as it causes neither harmful by-products nor contamination of the semiconductor element. The concentration of oxidizing agent such as hydrogen peroxide in the etching agent 27 is preferably in a range of 0.2 mol/L to 8 mol/L, more preferably in a range of 1.0 mol/L to 4.0 mol/L, and even more preferably in a range of 2.0 mol/L to 4.0 mol/L.

By etching the surface of the substrate 21 in the structure 20 as described above, the product is manufactured. In an example, the etched structure 20 is cleaned after the etching.

Figure 5:
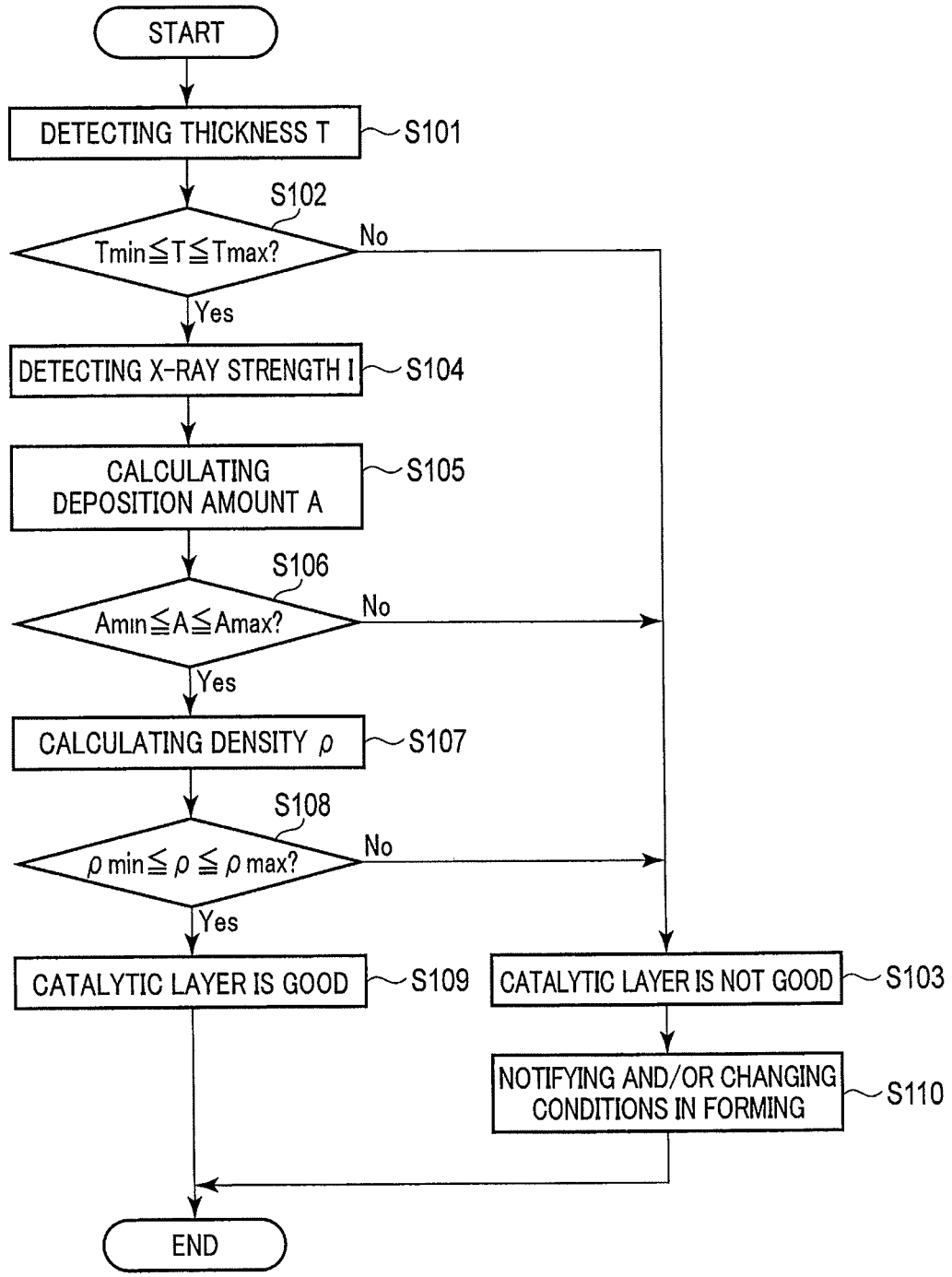
FIG. 5 is a flowchart showing a process performed by a determination device according to the first embodiment.

Next, the process taking place at the determination device 3 will be described. FIG. 5 is a flowchart showing the process performed by the determination device 3. As shown in FIG. 5, the determination device 3 measures and detects, as a detection parameter, using a laser microscope 12, a thickness T of the catalytic layer 22 of the structure 20 (S101). Here, the determination device 3 may detect a measured value of thickness in a single site in the catalytic layer 22 as thickness T, or may detect an average value of measured values of thicknesses in a plurality of sites in the catalytic layer 22 as thickness T. The controller 13 then determines whether or not the detected thickness T is within a predetermined range of a lower limit value Tmin or more and an upper limit value Tmax or less (S102). If the thickness T is not within the predetermined range (S102—No), the controller 13 determines that the catalytic layer 22 has not been formed into a state suitable for the etching (S103). In other words, the controller 13 determines that the formed catalytic layer 22 is not good.

If the thickness T is within the predetermined range (S102—Yes), the determination device 3 measures and detects an X-ray intensity I of the character X-rays generated by irradiating the catalytic layer 22 with X-rays using the XRF analysis device 11 (S104). In other words, the determination device 3 measures and detects the X-ray intensity I of fluorescent X-rays unique to the noble metal forming the catalytic layer 22. In one example, the determination device 3 irradiates X-rays only to one site in the structure 20, and detects the measured value of the X-ray intensity in that one site as the X-ray intensity I. In another example, the determination device 3 irradiates X-rays to a plurality of sites different with respect to each other in the structure 20, and measures the X-ray intensity of the character X-rays for each of the sites irradiated with the X-rays. Then, the determination device 3 detects the average value of the measured values of the X-ray intensity at the plurality of sites as the X-ray intensity I.

Further, if the spot diameter of the irradiated X-rays is larger than the width of the opening of the mask layer 23, the mask layer 23 is included, in addition to the catalytic layer 22, within the spot of the irradiated X-ray. In that case, in one example, the controller 13 sets, as the X-ray intensity I, the measured value of the X-ray intensity. In another example, the controller 13 calculates, by using the measured value of the X-ray intensity and the ratio of the region occupied by the mask layer 23 etc., the X-ray intensity if only the catalytic layer 22 is within the spot of the irradiated X-rays, and then sets, as the X-ray intensity I, the calculation value. In other words, the X-ray intensity in a case of which 100% of the spot interior is the catalytic layer 22 becomes the detected X-ray intensity I. It is assumed that, for example, the mask layer 23 with an opening ratio of 50% is formed, and X-rays are irradiated in a state in which the mask layer 23 occupies 50% of the spot. In that case, assuming the measured value Ia of the X-ray, the calculation value (Ib=2Ia) that is the X-ray intensity when the inside of the spot is only the catalytic layer 22 is calculated. The calculation value Ib is then detected as the X-ray intensity I.

The controller 13 then calculates, from the detected X-ray intensity I, the deposition amount A of noble metal per unit area in the catalytic layer 22 (S105). Here, the controller 13 may calculate the deposition amount A based on the measured value of the X-ray intensity in a single site, or may calculate the deposition amount A based on measured values of X-ray intensity at a plurality of sites and the average value of these measured values. For example, the controller 13 is stored, in the storage medium, a function for converting the X-ray intensity I into the deposition amount A per unit area. The controller then calculates the deposition amount A using the measured and detected X-ray intensity I and the stored function.

The controller 13 then determines whether or not the calculated deposition amount A per unit area is within a predetermined range of a lower limit value Amin or more and an upper limit value Amax or less (S106). If the deposition amount A is not within the predetermined range (S106-No), the controller 13 determines that the catalytic layer 22 has not been formed into a state suitable for the etching (S103). In other words, the controller 13 determines that the formed catalytic layer 22 is not good.

If the deposition amount A is within the predetermined range (S106—Yes), the controller 13 uses both the thickness T of the catalytic layer 22 and the deposition amount A of the noble metal per unit area in the catalytic layer 22 to calculate a density $\rho$ of the catalytic layer 22 (S107). In general, the density $\rho$ is calculated by dividing the deposition amount A by the thickness T. Therefore, the density $\rho$ is calculated using both the X-ray intensity I of the character X-rays detected using the XRF analysis device 11, and the thickness T of the catalytic layer detected using the laser microscope 12.

The controller 13 then determines whether or not the calculated density $\rho$ of the catalytic layer 22 is within a predetermined range of a lower limit value $\rho$min or more and an upper limit value $\rho$max or less (S108). If the density $\rho$ is not within the predetermined range (S108-No), the controller 13 determines that the catalytic layer 22 has not been formed into a state suitable for the etching (S103). In other words, the controller 13 determines that the formed catalytic layer 22 is not good.

If the density ρ is within the predetermined range (S106—Yes), the controller 13 determines that the catalytic layer 22 has been formed into a state suitable for the etching (S109). In other words, the controller 13 determines that the formed catalytic layer 22 is good. As described above, in the present embodiment, the determination device 3 including the controller 13 obtains, as determination parameters, the thickness T of the catalytic layer 22, the deposition amount A of noble metal per unit area in the catalytic layer 22, and the density ρ of the catalytic layer 22. The controller 13 then determines, based on determination parameters, whether the catalytic layer 22 has been formed into a state suitable for etching the surface of the substrate 21. In the present embodiment, only if all of the determination parameters are within the predetermined range, the controller 13 determines that the catalytic layer 22 has been formed into a state suitable for the etching. In other words, the controller 13 determines that the catalytic layer 22 has not been formed into a state suitable for the etching if one or more of determination parameters are not within the predetermined range.

Here, the deposition amount A that is one of determination parameters is calculated using the XRF analysis device 11 to detect the X-ray intensity I of the character X-ray and using the detected X-ray intensity I. The thickness T being also one of determination parameters is a detection parameter that is detected using the laser microscope 12 and that is associated with the catalytic layer 22. The density ρ being also one of determination parameters is calculated using both the deposition amount A and the thickness T, and is calculated using the X-ray intensity I detected by the XRF analysis device 11.

Furthermore, in the present embodiment, when it has been determined that the catalytic layer 22 has not been formed into a state suitable for the etching (S103), the controller 13 performs at least one of: notifying that the catalytic layer 22 is not in a suitable state and changing the conditions in the forming of the catalytic layer 22 into the substrate 21 (S110). In the case of notifying, the controller 13 notifies, by either screen display, sound transmission, or turning on a light, that the catalytic layer 22 has not been formed into a state suitable for the etching.

In the case of changing the conditions, the controller 13 changes, at the catalytic layer forming device 2, either the time for immersion in the plating solution, the temperature of the plating solution, or the concentration of the plating solution. For example, if one or more of: the deposition amount A and the thickness T are smaller than the lower limit value of the predetermined range, the controller 13 increases the immersion time in the plating solution as compared to prior to the change. Vice versa, if one or more of the: deposition amount A and thickness T are higher than the upper limit value of the predetermined range, the controller 13 reduces the immersion time in the plating solution as compared to prior to the change. If the aforementioned density ρ is smaller than the lower limit value of the predetermined range, the controller 13 reduces either the temperature of the plating solution or the concentration of the plating solution as compared to prior to the change. Vice versa, if the density ρ is higher than the upper limit value of the predetermined range, the controller 13 increases either the temperature of the plating solution or the concentration of the plating solution as compared to prior to the change.

As described above, when it has been determined that the catalytic layer 22 has not been formed into a state suitable for the etching, the structure 20 is discarded, or the catalytic layer 22 is reformed in the catalytic layer forming device 2. If the catalytic layer 22 is reformed, the already formed catalytic layer 22 is destroyed by dissolution or the like, and removed from the surface of the substrate 21. After the catalytic layer 22 is removed, a noble metal is deposited under changed conditions on the surface of the substrate 21 to newly form the catalytic layer 22.

When, for example, one or more of the aforementioned determination parameters (deposition amount A, density ρ, thickness T) are smaller than the lower limit value of the predetermined range, and each of all of the determination parameters is smaller than the upper limit value of the predetermined range, the catalytic layer 22 can be reformed without removing the already formed catalytic layer 22 from the surface of the substrate 21. In other words, the catalytic layer 22 can be reformed without destroying the already formed catalytic layer 22. In that case, in the state where the catalytic layer 22 has already been formed, the noble metal is further deposited on the surface of the substrate 21. Then, by the already formed catalytic layer and the newly deposited noble metal, a new catalytic layer 22 is reformed. Here, the parameters such as time of immersion in the plating solution, temperature of the plating solution, and concentration of the plating solution are set based on how small of the determination parameters that are not within the predetermined range are with respect to the lower limit value of the predetermined range.

Here, FIG. 6 shows an example of the structure 20 in a case in which the density ρ and the deposition amount A are each smaller than the lower limit value of the predetermined range. FIG. 7 shows the state of the structure 20 of FIG. 6 in which the etching agent 27, under the action of the catalyst of the catalytic layer, is etching the surface of the substrate 21. As shown in FIG. 6 and FIG. 7, when the density ρ and the deposition amount A are each smaller than the lower limit value of the predetermined range, the catalyst particles 25 of the catalytic layer 22 run short as compared to a state suitable for the etching, and at the same time, the interspaces between the catalyst particles 25 of the catalytic layer 22 increase in size. For this reason, on the surface of the substrate 21, the portions in which the catalyst particles 25 are close to the surface of the substrate 21 are etched, whereas the portions corresponding to the interspaces between the catalyst particles 25 tend not to oxidize and the etching tends not to progress. Therefore, in the portions corresponding to the interspaces between the catalyst particles 25 on the surface of the substrate 21, needle-like residual portions 28 in which the substrate 21 remains needle-formed tend to be formed.

Further, in the state in which the catalyst particles 25 of the catalytic layer 22 run short and the interspaces between the catalyst particles 25 is large, the direction in which the etching is progressing tends to bend away from the direction perpendicular to the surface (main surface) of the substrate 21. This may reduce the vertical etching workability on the surface of the substrate 21.

Figure 9:
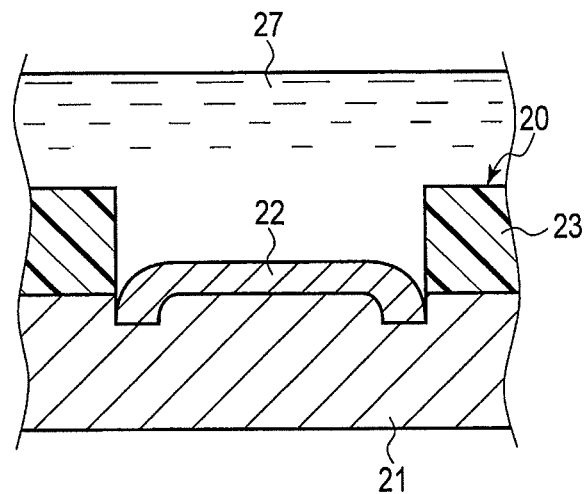
FIG. 9 is a schematic view showing the etching agent etching the surface of the substrate in the structure of FIG. 8 under the action of the catalyst of the catalytic layer.

Further, FIG. 8 shows an example of the structure 20 in the case where the density ρ is higher than the upper limit value of the predetermined range, and FIG. 9 shows the structure 20 of FIG. 8 in the state in which the etching agent 27, under the action of the catalyst of the catalytic layer, is etching the surface of the substrate 21. When the density ρ is higher than the upper limit value of the predetermined range, the interspaces between the catalyst particles 25 of the catalytic layer 22 almost disappear, whereas in some cases, they become a continuous film, as shown in FIGS. 8 and 9. For this reason, the etching agent 27 tends not to reach the surface of the substrate 21, and the progressing rate of etching (etching rate) may reduce. Further, in the state in which the interspaces between the catalyst particles 25 are almost completely eliminated, the etching agent 27 tends not to pass between the catalyst particles 25, but passes between the mask layer 23 and the catalytic layer 22 to reach the surface of the substrate 21. For this reason, in the portion in which the catalytic layer 22 is formed on the surface of the substrate 21, the etching may proceed locally only in the region near the mask layer 23. As a result, etching uniformity may decrease across the entire portion in which the catalytic layer 22 is formed.

In the present embodiment, the determination device 3 determines, before etching, whether the catalytic layer 22 is in a state suitable for the etching. The etching is then performed only for the structure 20 for which it has been determined that the catalytic layer 22 is in a state suitable for the etching. When each of all of the determination parameters is within the predetermined range and the catalytic layer 22 is in a state suitable for the etching, the etching, as shown in FIGS. 3 and 4, is performed with the direction in which the etching is progressing almost no bending away from the direction perpendicular to the surface of the substrate 21 (main surface). Thus, the vertical etching workability is high. Also, when the catalytic layer 22 is in a state suitable for the etching, the interspaces between the catalyst particles 25 have the proper size, the etching agent 27 reaches the surface of the substrate 21, and the etching is performed at a proper etching speed. Also, when the catalytic layer 22 is in a state suitable for the etching, the needle-like residual portions 28 in which the substrate 21 remains needle-formed tend not to be formed. Also, when the catalytic layer 22 is in a state suitable for the etching, in the portion in which the catalytic layer 22 is formed, locally etching a partial region is effectively prevented. Therefore, the entire portion in which the catalytic layer 22 is formed in the surface of the substrate 21 is etched uniformly or substantially uniformly.

Here, when the deposition amount A, the density ρ, and the thickness T are used as determination parameters, in one example, a lower limit value and an upper limit value of the predetermined range are set as shown in Table 1 for each of: the deposition amount A, the density ρ, and the thickness T.

TABLE 1

| Determination parameter | Lower limit value | Upper limit value |
| --- | --- | --- |
| Deposition amount A (μg/cm²) | 100 | 160 |
| Density ρ (g/cm³) | 5 | 16 |
| Thickness T (nm) | 100 | 200 |

In the present example in which the lower limit value and the upper limit value shown in Table 1 are set, a semiconductor substrate is used as the substrate 21 and gold is used as the noble metal that forms the catalytic layer 22. The opening ratio of the mask layer 23 is 50%. The catalytic layer 22 is then irradiated with X-rays of an X-ray intensity of 10000 CPS (Counts Per Second), and the spot diameter of the irradiated X-rays is 100 μm. The mask layer 23 then occupies 50% of the area inside the irradiated X-ray spot, while the catalytic layer 22 occupies the remaining 50% of the area. Detected as the X-ray intensity I of the character X-rays unique to the catalytic layer 22 is the X-ray intensity when 100% of the spot becomes the catalytic layer 22. Therefore, the detected X-ray intensity I is twice the measured value. The deposition amount A is then, as described above, calculated from the detected X-ray intensity I, and the thickness T is detected using the laser microscope 12. The density ρ is then calculated using both the deposition amount A and the thickness T. It should be noted that in the present example, since the deposition amount A and the density ρ are calculated as described above, the calculated deposition amount A and the density ρ are not the values when the catalytic layer 22 occupies 50% of the area within the X-ray spot. In other words, not the values in the actual state in which the opening ratio of the mask layer 23 is 50% are calculated as the deposition amount A and the density ρ, but rather the conversion values when the inside of the X-ray spot is only the catalytic layer 22 are calculated as the deposition amount A and the density ρ.

In the present example, when performing the determination according to the flowchart shown in FIG. 5, it is determined whether the thickness T is within a predetermined range of 100 nm or more and 200 nm or less. If the thickness T is within the predetermined range, it is determined whether or not the deposition amount A is within a predetermined range of 100 μg/cm² or more and 160 μg/cm² or less. If the deposition amount A is within the predetermined range, it is determined whether or not the density ρ is within a predetermined range of 5 g/cm³ or more and 16 g/cm³ or less. Then, only if the thickness T, the deposition amount A, and the density ρ are all within the predetermined range, it is determined that the catalytic layer 22 has been formed into a state suitable for the etching.

As described above, in the present embodiment, the deposition amount A, the density ρ, and the thickness T are obtained as determination parameters, and it is determined, based on whether or not each of the determination parameters is within the predetermined range, whether or not the catalytic layer 22 has been formed into a state suitable for the etching. Here, the deposition amount A, the density ρ, and the thickness T affect the etching, and, especially the density ρ and the deposition amount A calculated from the X-ray intensity I detected using the XRF analysis device 11 largely affect the etching. Etching is properly performed when the deposition amount A and the density ρ are each in the predetermined range suitable for the etching. Therefore, in the present embodiment, because the determination is performed based on whether the deposition amount A and the density ρ are each within the predetermined range suitable for the etching, the determination whether or not the catalytic layer 22 has been formed into a state suitable for etching.

Further, in the present embodiment, the XRF analysis device 11 is used to detect the X-ray intensity I of the character X-rays unique to the catalytic layer 22 without the catalytic layer 22 being destroy by dissolution or the like. Also, using the laser microscope 12, the thickness T of the catalytic layer 22 is detected without destroying the already formed catalytic layer 22. Then, from the detected X-ray intensity I, the deposition amount A of noble metal per unit area in the catalytic layer 22 is calculated, and using both the X-ray intensity I and the thickness T, the density ρ of the catalytic layer 22 is calculated. Therefore, the deposition amount A, the density ρ, and the thickness T that are determination parameters are obtained without destroying the formed catalytic layer by dissolution or the like. For this reason, it is examined and determined whether or not the catalytic layer 22 in the structure 20 has been formed into a state suitable for the etching without destroying the already formed catalytic layer 22.

Since the examination and the determination are performed without destroying the already formed catalytic layer 22, it is possible to determine whether or not the catalytic layer 22 has been formed into a state suitable for the etching in-line of a manufacturing line for forming a product by etching. Since the examination and the determination are performed without destroying the already formed catalytic layer 22, it is further possible to determine whether or not the catalytic layer 22 has been formed into a state suitable for the etching with regard to each of all the structures 20.

(Validation Associated with the Embodiment)

Hereinafter, a validation associated with the aforementioned embodiment will be described. Subject to the validation were three structures 20A to 20C. In the structures 20A to 20C, the catalytic layer 22 was formed so that the aforementioned thickness T, the deposition amount A, and the density ρ were different from each other. In the validation, the lower limit value and the upper limit value of the predetermined range for each of: the thickness T, the deposition amount A, and the density ρ were set as shown in Table 1. Then, the mask layer 23 and the catalytic layer 22 were formed in the same manner as in the example in which the predetermined range was set as shown in Table 1. Further, in the validation, the detections of the X-ray intensity I and the thickness T, and the calculations of the deposition amount A and the density ρ were performed in the same manner as in the example in which the predetermined range was set as shown in Table 1. Therefore, the conversion values when the inside of the X-ray spot is only the catalytic layer 22 are calculated as the deposition amount A and the density ρ.

In the validation, each of the structures 20A to 20C was etched using the etching agent 27. The etching agent 27 utilized an etching solution containing hydrofluoric acid and an oxidizing agent, and used hydrogen peroxide as the oxidizing agent. The concentration of hydrogen fluoride in the etching agent 27 was set to 7.5 mol/L, and the concentration of hydrogen peroxide in the etching agent 27 was set to 2 mol/L. Then, in the validation, the etching rate (rate of progression of the etching) was measured for each of the structures 20A to 20C. Also, in the validation, the uniformity of the etched cross section that was etched in the substrate 21 was observed for each of the structures 20A to 20C.

Table 2 shows the deposition amount A of the noble metal per unit area and the thickness T of the catalytic layer 22 for each of the structures 20A to 20C used in the validation. Table 2 further shows the etching rate for each of the structures 20A to 20C.

TABLE 2

| Structure type | Deposition amount A (μg/cm²) | Thickness T (nm) | Etching rate (μm/min) |
| --- | --- | --- | --- |
| Structure 20A | 116 | 151 | 1.17 |
| Structure 20B | 144 | 145 | 1.10 |
| Structure 20C | 190 | 197 | 1.17 |

As shown in Table 2, in each of the structures 20A to 20C, the thickness T was in the predetermined range of 100 nm or more and 200 nm or less. Further, in each of the structures 20A to 20C, the density ρ obtained by dividing the deposition amount A by the thickness T was within the predetermined range of 5 g/cm³ or more and 16 g/cm³ or less. However, in each of the structures 20A and 20B, the deposition amount A was within the predetermined range of 100 μg/cm² or more and 160 μg/cm² or less, whereas in the structure 20C, the deposition amount A was greater than the aforementioned upper limit value (160 μg/cm²) of the predetermined range.

Further, as shown in Table 2, the etching rate was 1.17 μm/min for the structure 20A, 1.10 μm/min for the structure 20B, and 1.17 μm/min for the structure 20C. Therefore, in the structures 20A to 20C, the etching rates were hardly any different from each other. However, in the structure 20C in which the deposition amount A was higher than the aforementioned upper limit value of the predetermined range, the etched cross section was non-uniform as compared to the structures 20A and 20B. That is, in the structure 20C, the etching uniformity in the portion in which the catalytic layer 22 had been formed was lower than in the structures 20A and 20B.

From the aforementioned validation, it was proven that when the deposition amount A is higher than the upper limit value of the predetermined range, the etched cross section becomes non-uniform, and the etching uniformity decline, even when each of the density ρ and the thickness T is within the predetermined range. It was thus proven that when the deposition amount A is not within the predetermined range, the catalytic layer 22 has not been formed into a state suitable for the etching, even if each of the density ρ and the thickness T is within the predetermined range.

(Modifications)

It should be noted that although in the aforementioned embodiment the deposition amount A, the density ρ, and the thickness T are used as determination parameters for determining whether or not the catalytic layer 22 is in a state suitable for the etching, it is not limited thereto. As an example, if the deposition amount A is used as a determination parameter, at least one of: the density ρ and the thickness T may not be used in the determination with regard to the catalytic layer 22. Similarly, if the density ρ is used as a determination parameter, at least one of: the deposition amount A and the thickness T may not be used in the determination with regard to the catalytic layer 22. However, in any case, at least one of: the density ρ and the deposition amount A calculated from the X-ray intensity I detected by the XRF analysis device 11 is used as a determination parameter in the determination with regard to the catalytic layer 22. Therefore, when the thickness T detected by a laser microscope 12 is used as a determination parameter, either the density ρ or the deposition amount A calculated from the X-ray intensity I is used, in addition to the thickness T, as a determination parameter. Moreover, in any case, only if all of the determination parameters are within the predetermined range, it is determined that the catalytic layer 22 has been formed into a state suitable for the etching.

Further, in a modification, instead of or in addition to the deposition amount A and the density ρ, any of the X-ray intensity I detected by the XRF analysis device 11 and the parameters other than the density ρ and the deposition amount A calculated using the X-ray intensity I may be used as a determination parameter in the determination with regard to the catalytic layer 22. In that case as well, the determination device 3 determines, based on whether or not each of the determination parameters is within the predetermined range, whether or not the catalytic layer 22 has been formed into a state suitable for the etching. Then, only if all of the determination parameters are within the predetermined range, it is determined that the catalytic layer 22 has been formed into a state suitable for the etching.

Here, parameters other than the density ρ and the deposition amount A calculated by the X-ray intensity I include the calculated parameter α calculated by dividing the X-ray intensity I by the thickness T, and the porosity γ of the catalytic layer 22. The calculated parameter α can be used as a determination parameter and is calculated using both the X-ray intensity I detected by the XRF analysis device 11 and the thickness T of the catalytic layer detected by the laser microscope 12. To calculate the porosity γ, the density ρ of the catalytic layer 22 is divided by a bulk density β of the noble metal that forms the catalytic layer 22. The porosity γ is then calculated by subtracting the divided value from 1. As a result, the porosity γ is 1−ρ/β. The porosity γ that can be used as a determination parameter is therefore calculated using both the X-ray intensity I detected by the XRF analysis device 11 and the thickness T of the catalytic layer detected by the laser microscope 12. The bulk density β of the noble metal that forms the catalytic layer 22 is a value which is determined corresponding to the type of the noble metal that forms the catalytic layer 22. The density β may be set by a operator or the like at the determination device 3, or may be stored in a storage medium of the controller 13 or the like.

Further, in a modification, the determination device 3 includes an SEM (Scanning Electron Microscope). In that case, the determination device 3 may or may not include the laser microscope 12. However, in any case, the determination device 3 detects the aforementioned X-ray intensity I using the XRF analysis device 11. The determination device 3 then obtains as the aforementioned determination parameter any one of the detected X-ray intensity I and the parameter calculated by the X-ray intensity I, and then determines, based on a determination parameter, whether or not the catalytic layer 22 has been formed into a state suitable for the etching.

In the present modification, the determination device 3 detects, as a detection parameter, using the scanning electron microscope, a coverage factor ε of the catalytic layer 22. The determination device 3 may detect, as the coverage factor ε, the measured value of the coverage factor in a single site of the catalytic layer 22, and may detect, as the coverage factor ε, the average value of the measured values of the coverage factors in a plurality of sites in the catalytic layer 22. It should be noted that when measuring the coverage factor ε, the catalytic layer 22 is photographed from the side of the surface using the scanning electron microscope. Then, the ratio of the area occupied by the noble metal (catalyst particles 25) in the range of imaging of the catalytic layer 22 by the scanning electron microscope is measured as the coverage factor ε.

In an example, the controller 13 of the determination device 3 obtains, as a determination parameter, the detected coverage factor ε in addition to any of the X-ray intensity I and the parameter calculated using the X-ray intensity I. The determination device 3 then determines, based on the coverage factor ε in addition to either the X-ray intensity I or the parameter calculated using the X-ray intensity I, whether or not the catalytic layer 22 is in a state suitable for the etching. In that case, the determination device 3 performs the determination based on whether or not the detected coverage factor ε is within a predetermined range of a lower limit value εmin or more and an upper limit value εmax or less. Then, only if all of the determination parameters are within the predetermined range, it is determined that the catalytic layer 22 has been formed into a state suitable for the etching. However, if the coverage factor ε being a parameter detected by the scanning electron microscope is used as a determination parameter, any of the X-ray intensity I and the aforementioned parameter calculated from the X-ray intensity I is used in addition to the coverage factor ε as a determination parameter.

Further, in another example, the determination device detects the X-ray intensity I of the character X-rays using the XRF analysis device 11 and detects the coverage factor ε of the catalytic layer 22 using the scanning electron microscope. The determination device 3 then obtains, as a determination parameter, a calculated parameter η obtained by dividing the X-ray intensity I by the coverage factor ε. The determination device 3 then determines whether the catalytic layer 22 has been formed into a state suitable for the etching based on whether or not the calculated parameter η being a determination parameter is a lower limit value η min or more and an upper limit value ηmax or less. It should be noted that the calculated parameter η is calculated using both the X-ray intensity I and the coverage factor c detected by the scanning electron microscope. When using the calculated parameter η as a determination parameter, either only the calculated parameter η may be used as a determination parameter, or, in addition to the calculated parameter 11, any of the aforementioned parameters such as the X-ray intensity I, the deposition amount A, and the density ρ may be used as determination parameters.

In this regard, Table 3 shows an example of the lower limit value and the upper limit value of the predetermined range for each of: the X-ray intensity I, the calculated parameter α calculated by dividing the X-ray intensity I by the thickness, and the calculated parameter η calculated by dividing the X-ray intensity I by the coverage factor ε when used as determination parameters. It should be noted that Table 3 is an example of when the mask layer 23 and the catalytic layer 22 are formed similarly as in the example of the predetermined range set as in Table 1. Table 3 is further an example of when the X-ray intensity I and the thickness T are detected, and the deposition amount A and the density ρ are calculated similarly as in the example in which the predetermined range is set as in Table 1. Therefore, the conversion values when the inside of the X-ray spot is only the catalytic layer 22 are calculated as the deposition amount A and the density ρ.

TABLE 3

| Determination parameter | Lower limit value | Upper limit value |
|---|---|---|
| X-ray intensity I (CPS) | 4.55 | 6.87 |
| Calculated parameter α (CPS/nm) | 0.023 | 0.069 |
| Porosity γ (%) | 26 | 83 |
| Coverage ε (%) | 70 | 90 |
| Calculated parameter η | 5.06 | 9.81 |

In the aforementioned embodiments including the first embodiment and the modification, the aforementioned determination with regard to the catalytic layer 22 is performed based on one or more determination parameters. The first determination parameter being any one of the one or more determination parameters is either the X-ray intensity I detected by the XRF analysis device 11 or a parameter calculated using the X-ray intensity I. In the aforementioned embodiments, the parameters calculated using the X-ray intensity I include the deposition amount A, the density ρ, the calculated parameter α, the porosity γ, and the calculated parameter r.

In an example, the laser microscope 12 or the scanning electron microscope is used to detect a detection parameter associated with the catalytic layer 22, and a parameter calculated using both the X-ray intensity I and the detection parameter are used as the first determination parameters. In the aforementioned embodiments, the parameter detected using the laser microscope 12 is the thickness T, and the parameter detected using the scanning electron microscope is the coverage factor ε. Further, the parameters calculated using both the X-ray intensity I and the detection parameter that is the thickness T are the density ρ, the calculated parameter α and the porosity γ. Also, the parameters calculated using both the X-ray intensity I and the detection parameter that is the coverage factor ε is the calculated parameter η.

Further, in an embodiment, the aforementioned determination with regard to the catalytic layer 22 is performed based on a plurality of determination parameters, and is performed based on, in addition to the first determination parameter, a second determination parameter different from the first determination parameter. In this case as well, the first determination parameter is either the X-ray intensity I detected using the XRF analysis device 11 or the parameter calculated using the X-ray intensity I. Moreover, as the second determination parameter, it is both possible to either use the X-ray intensity I or the parameter calculated using the X-ray intensity I, and to use the parameter detected using the laser microscope 12 or the scanning electron microscope.

Further, the calculations and determinations performed by the determination device 3 in the aforementioned embodiments may be performed by an operator in a process of manufacturing a product. In that case, the operator performs the aforementioned calculations and determinations based on the measured values and the detection results from the XRF analysis device 11. For this, the operator may use the measured values and the detection results of any of the laser microscope 12 and the scanning electron microscope.

In the processing system according to at least one of the aforementioned embodiments or examples, one or more processing devices detects the X-ray intensity of character X-rays generated by irradiating the catalytic layer of the noble metal formed on the surface of the substrate with X-rays. The processing device obtains, as a determination parameter, any of the detected X-ray intensity and the parameter calculated using the X-ray intensity. The processing device then determines, based at least on the determination parameter, whether or not the catalytic layer has been formed into a state suitable for etching the surface of the substrate. In this manner, it is possible to provide a processing system and a determining method by which whether or not the catalytic layer of a noble metal is formed on the surface of the substrate in a state suitable for the etching is properly determined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A processing system comprising one or more processing devices, the one or more processing devices being configured to:
    detect an X-ray intensity of character X-rays that are generated by irradiating a catalytic layer of a noble metal formed on a surface of a substrate with X-rays;
    obtain, as a first determination parameter, any one of the detected X-ray intensity and a parameter calculated using the X-ray intensity; and
    determine, based at least on the first determination parameter, whether or not the catalytic layer has been formed into a state suitable for etching the surface of the substrate,
    detect, using a laser microscope or a scanning electron microscope, a detection parameter in association with the catalytic layer;
    obtain, as a second determination parameter, the detection parameter from the laser microscope or the scanning electron microscope or a parameter calculated using the detection parameter; and
    determine, based on the second determination parameter in addition to the first determination parameter, whether or not the catalytic layer has been formed into a form suitable for the etching.

2. The processing system according to claim 1, wherein the one or more processing devices are configured to:
    calculate, from the detected X-ray intensity, a deposition amount of the noble metal per unit area in the catalytic layer; and
    obtain, as the first determination parameter, the calculated deposition amount.

3. The processing system according to claim 1, wherein the one or more processing devices are configured to determine, based on whether or not the first determination parameter is within a predetermined range, whether or not the catalytic layer is formed into a state suitable for the etching.

4. The processing system according to claim 1, wherein the one or more processing devices are configured to determine, based on whether or not the second determination parameter is within a predetermined range, whether or not the catalytic layer has been formed into a form suitable for the etching.

5. The processing system according to claim 1, wherein the one or more processing devices are configured to:
    detect, as the detection parameter, using the laser microscope, a thickness of the catalytic layer; and
    obtain, as the second determination parameter, the detected thickness of the catalytic layer.

6. The processing system according to claim 1, wherein the one or more processing devices are configured to obtain, as the second determination parameter, a parameter calculated using both the X-ray intensity and the detection parameter from the laser microscope or the scanning electron microscope.

7. The processing system according to claim 6, wherein the one or more processing devices are configured to:
    detect, as the detection parameter, using the laser microscope, a thickness of the catalytic layer;
    calculate, using both the X-ray intensity and the detected thickness of the catalytic layer, a density of the catalytic layer; and
    obtain, as the second determination parameter, the calculated density of the catalytic layer.

8. A processing system comprising one or more processing devices, the one or more processing devices being configured to:

detect an X-ray intensity of character X-rays that are generated by irradiating a catalytic layer of a noble metal formed on a surface of a substrate with X-rays;

obtain, as a first determination parameter, any one of the detected X-ray intensity and a parameter calculated using the X-ray intensity;

determine, based at least on the first determination parameter, whether or not the catalytic layer has been formed into a state suitable for etching the surface of the substrate; and perform, if it is determined that the catalytic layer has not been formed into a state suitable for the etching, at least one of: a notification that the catalytic layer is not in a suitable state and a change of conditions for forming the catalytic layer of the noble metal onto the substrate.

9. The processing system according to claim 8, wherein the one or more processing devices are configured to:

detect, using a laser microscope or a scanning electron microscope, a detection parameter in association with the catalytic layer; and obtain, as the first determination parameter, a parameter calculated using both the X-ray intensity and the detection parameter detected using the laser microscope or the scanning electron microscope.

10. The processing system according to claim 9, wherein the one or more processing devices are configured to:

detect, as the detection parameter, using the laser microscope, a thickness of the catalytic layer;

calculate, using both the X-ray intensity and the detected thickness of the catalytic layer, a density of the catalytic layer; and obtain, as the first determination parameter, the calculated density of the catalytic layer.

11. A processing system comprising one or more processing devices, the one or more processing devices being configured to:

detect an X-ray intensity of character X-rays that are generated by irradiating a catalytic layer of a noble metal formed on a surface of a substrate with X-rays;

calculate, from the detected X-ray intensity, a deposition amount of the noble metal per unit area in the catalytic layer;

detect a thickness of the catalytic layer by using a laser microscope;

calculate, using both the calculated deposition amount and the detected thickness of the catalytic layer, a density of the catalytic layer; and determine, based at least on the calculated density, whether or not the catalytic layer has been formed into a state suitable for etching the surface of the substrate.

* * * * *